United States Patent
Chen et al.

(10) Patent No.: US 10,141,862 B1
(45) Date of Patent: Nov. 27, 2018

(54) POWER SUPPLY DEVICE

(71) Applicant: FORD GLOBAL TECHNOLOGIES, LLC, Dearborn, MI (US)

(72) Inventors: Lihua Chen, Farmington Hills, MI (US); Fan Wang, Novi, MI (US); Baoming Ge, Okemos, MI (US); Fan Xu, Novi, MI (US); Shahram Zarei, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/926,311

(22) Filed: Mar. 20, 2018

(51) Int. Cl.
*H02M 7/00* (2006.01)
*H05K 7/20* (2006.01)
*H01L 23/34* (2006.01)

(52) U.S. Cl.
CPC ............ *H02M 7/003* (2013.01); *H01L 23/34* (2013.01); *H05K 7/2089* (2013.01); *H05K 7/20927* (2013.01)

(58) Field of Classification Search
CPC .. H02M 7/003; H05K 7/20927; H05K 7/2089
See application file for complete search history.

(56) References Cited

U.S. PATENT DOCUMENTS

| | | | |
|---|---|---|---|
| 7,129,808 B2 | 10/2006 | Roebke et al. | |
| 9,373,436 B2 | 6/2016 | Pal | |
| 9,888,591 B2* | 2/2018 | Nakatsu | H05K 5/0026 |
| 2013/0154081 A1* | 6/2013 | Kadoguchi | H01L 23/36 257/712 |
| 2013/0235527 A1* | 9/2013 | Wagner | H05K 1/0203 361/702 |
| 2014/0313806 A1* | 10/2014 | Shinohara | H05K 7/20927 363/141 |
| 2015/0315935 A1 | 11/2015 | Myers et al. | |
| 2017/0181333 A1* | 6/2017 | Kosaka | H05K 7/20254 |
| 2017/0182896 A1* | 6/2017 | Masip | B60L 11/1812 |

FOREIGN PATENT DOCUMENTS

EP 2833378 B1 4/2016

* cited by examiner

*Primary Examiner* — Kyle J Moody
(74) *Attorney, Agent, or Firm* — David Kelley; Brooks Kushman P.C.

(57) ABSTRACT

A power device supply includes an inverter, a converter, and a cooling system. The inverter is configured to convert direct electrical current into alternating electrical current. The converter has an inductor and is configured to amplify voltage. The cooling system has top, bottom, and intermediate cooling plates. The cooling system is arranged such that the inverter and inductor are interleaved with the plates and such that the inverter and inductor are disposed on opposing sides of the intermediate cooling plate.

20 Claims, 3 Drawing Sheets

POWER SUPPLY DEVICE

TECHNICAL FIELD

The present disclosure relates to electric vehicles and power supply devices for electric vehicles.

BACKGROUND

Electric and hybrid vehicles may include power modules that are configured to convert electrical power from direct to alternating current, or vice versa.

SUMMARY

A vehicle includes an electric machine, a power controller, and a cooling system. The power controller has inverting circuitry and an inductor. The power controller is configured to deliver electrical power to the electric machine. The cooling system has first, second, and third substantially parallel cooling plates. The cooling system is arranged such that the inverting circuitry and inductor are disposed on opposing sides of the second cooling plate, and such that the power controller is sandwiched between the first and third cooling plates.

A power supply device includes an inverter, a converter, and a cooling system. The inverter is configured to convert direct electrical current into alternating electrical current. The converter has an inductor and is configured to amplify voltage. The cooling system has top, bottom, and intermediate cooling plates. The cooling system is arranged such that the inverter and inductor are interleaved with the plates and such that the inverter and inductor are disposed on opposing sides of the intermediate cooling plate.

A power supply device includes a power module, an inductor, and a cooling system. The power module includes inverting circuitry. The cooling system has first, second, and third substantially parallel cooling plates. The cooling system is arranged such that the power module is sandwiched between the first and second cooling plates and such that the inductor is sandwiched between the second and third cooling plates.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
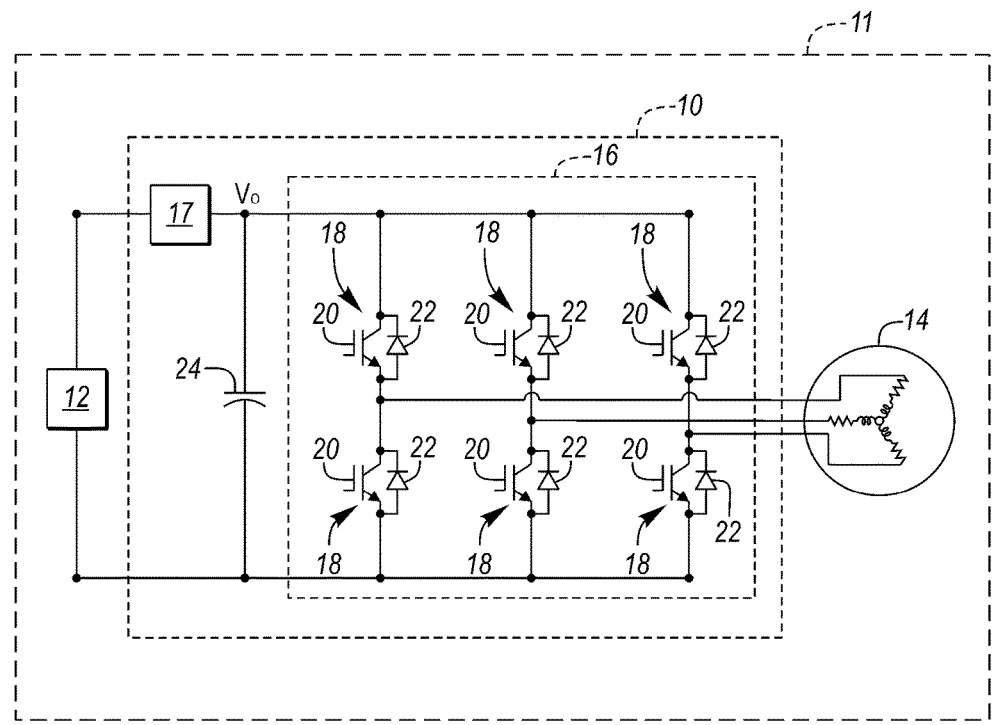
FIG. 1 is a circuit diagram illustrating a power controller (or power supply device) coupled to a power source and a load.

Referring to FIG. 1, a circuit diagram of a power controller (or power supply device) 10 coupled to a power source 12 and a load 14 is illustrated. The power controller 10 may be utilized in an electric drive system of a vehicle 11, such as an electric or hybrid vehicle. The power source 12 may be coupled to the power controller 10 in order to drive the load 14. In some contexts, including the context of an electric or hybrid vehicle, the power source 12 may be a battery, such as a traction battery, and the load 14 may be an electric machine, such as an electric motor or electric motor/generator. The power controller 10 may include a power module 16 and a voltage converter 17. The power module 16 and the voltage converter 17 may be configured to deliver electrical power to the load 14.

The power module 16 includes an inverter or inverting circuitry. The inverting circuitry may include switching units 18. The switching units 18 may each comprise a transistor 20, such as an insulated gate bipolar transistor (IGBT), in antiparallel with a diode 22. The switching units 18 may be configured to provide alternating current to the load 14. More specifically, the power module 16 may be configured to convert direct electrical current provided by the power source 12 into alternating electrical current, which is then delivered to the load 14. The power controller 10 may include a linking capacitor 24. The linking capacitor 24 may be disposed between the power source 12 and the power module 16. The linking capacitor 24 may be configured to absorb ripple currents generated at the power module 16 or the power source 12, and stabilize the DC-link voltage, Vo, for power module 16 control. Stated in other terms, the linking capacitor 24 may be arranged to limit voltage variation at an input of inverting circuitry due to ripple currents generated by the inverting circuitry in the power module 16 or a battery, such as a traction battery, that may comprise the power source 12.

The power module 16 may include additional circuitry (not shown) that is configured to convert alternating electrical current generated by the load 14 into direct electrical current, which is then delivered to the power source 12. This may occur, for example, when the load 14 is operating as a generator (e.g., during regenerative braking of the vehicle 11 or while being the load 14 is being powered by an additional power source such as an internal combustion engine) to recharge the power source 12 (e.g., a traction battery).

The voltage converter 17 may include an inductor. The circuitry of the voltage converter (not shown), including the inductor, may be configured to amplify or increase the voltage of the electrical power being delivered to the load 14 from the power source 12. The voltage converter 17 may include additional circuitry (not shown) or an additional converter (not shown) may be provided that is configured to decrease the voltage of the electrical power being delivered to the power source 12 from the load 14 during scenarios where the load is operating as a generator.

The disclosure should not be construed as limited to the circuit diagram in FIG. 1, but should include power control devices that include other types power modules, inverters, capacitors, converters, or combinations thereof. For example, the power module 16 may be an inverter that includes any number of switching units and not limited to the number of switching units depicted in FIG. 1. Alternatively, the linking capacitor 24 may be configured to couple one or a plurality of power modules or inverters to a power source.

Figure 2:
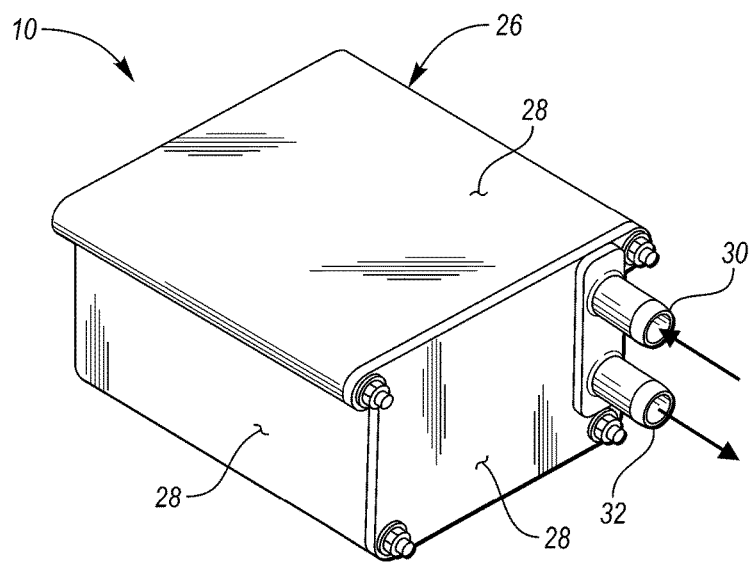
FIG. 2 is a perspective view of an external housing of the power controller.

Referring to FIG. 2 a perspective view of an external housing 26 of the power controller 10 is illustrated. The power module 16 (including the inverting circuitry) and the inductor of the voltage converter 17 are disposed within the external housing 26. Additional circuitry from the voltage converter 17 and the linking capacitor 24 may also be disposed within housing 26. A cooling system is also disposed within the housing 26. The housing 26 may comprise some of the components of the cooling system. For example, the exterior walls 28 of the housing may be "cooling plates" that define internal channels configured to route a coolant, refrigerant, or other cooling fluid. A supply tube or channel 30 may be configured to route the coolant from a source (e.g., a pump output) and into the cooling system. An outlet tube or channel 32 may be configured to route the coolant from the cooling system to a heat exchanger (e.g., a radiator or chiller) in order to reject the heat transferred into the coolant when flowed through the cooling system within the housing 26. The coolant may then be routed back to the source (e.g., pump) to repeat the process. The positions of the supply channel 30 and the outlet channel 32 may be adjusted and are therefore not limited to the depiction in FIG. 2. For example, the supply channel 30 and the outlet channel 32 may extend from a bottom or a top of the housing 26 as opposed to extending from a side of the housing 26.

Figure 3:
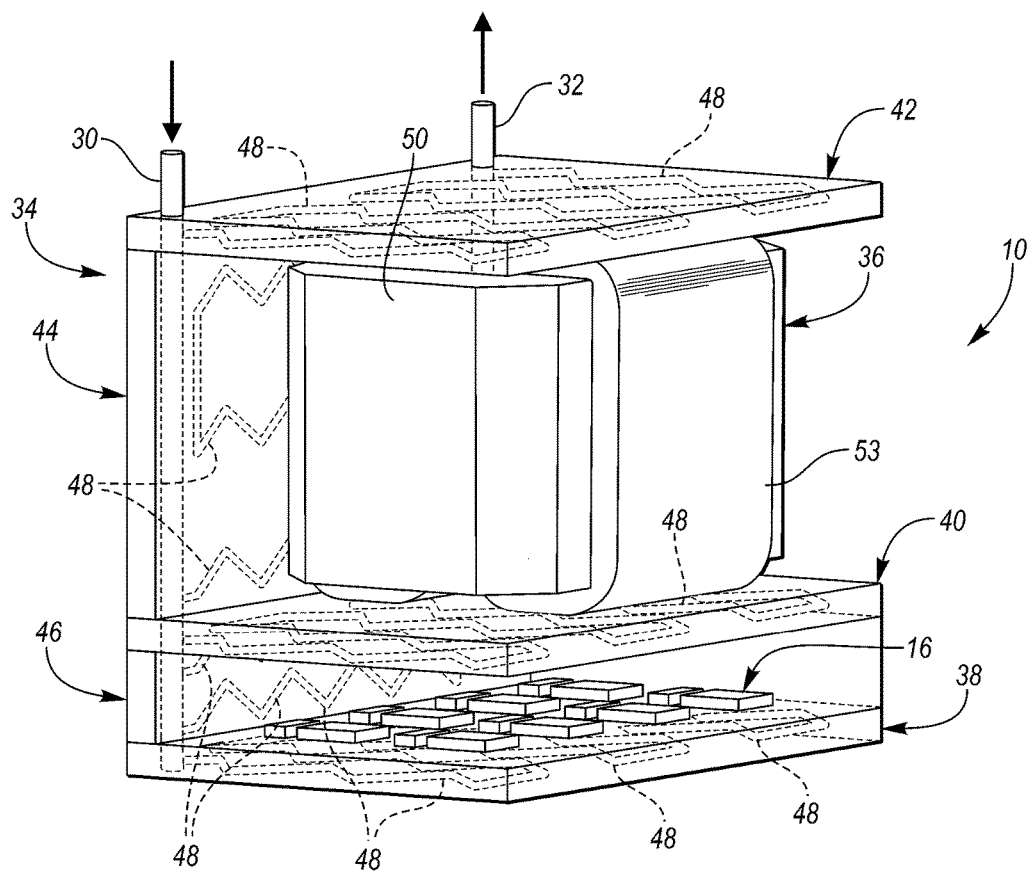
FIG. 3 is a perspective view of the power controller with portions of the external housing removed.

Referring to FIG. 3, a perspective view of the power controller 10 (with portions the external housing 26 removed) and the cooling system 34 is illustrated. The cooling system 34 that is disposed within housing is configured to cool both the power module 16 (including the inverting circuitry) and the inductor 36 of the voltage converter 17. The cooling system 34 may include a first (or bottom) cooling plate 38, a second (or intermediate) cooling plate 40, and a third (or top) cooling plate 42. The first cooling plate 38, second cooling plate 40, and third cooling plate 42 may be substantially parallel relative to each other. Substantially parallel may include an incremental value between exactly parallel to 20° from exactly parallel.

The cooling system 34 may be arranged such that the power module 16 (including the inverting circuitry) and the inductor 36 are interleaved with the first cooling plate 38, second cooling plate 40, and third cooling plate 42. The power module 16 (including the inverting circuitry) and the inductor 36 may be disposed on opposing sides of the second cooling plate 40 while the power controller 10 as a whole (including the power module 16 and inductor 36) is sandwiched between the first cooling plate 38 and the third cooling plate 42. More specifically, the power module 16 (including the inverting circuitry) may be sandwiched between the first cooling plate 38 and the second cooling plate 40 while the inductor 36 is sandwiched between the second cooling plate 40 and the third cooling plate 42.

The cooling system 34 may include a fourth (or first peripheral) cooling plate 44 that is adjacent to the inductor 36. The fourth cooling plate 44 extends between and is substantially perpendicular to the second cooling plate 40 and the third cooling plate 42. The cooling system 34 may include a fifth (or second peripheral) cooling plate 46 that is adjacent to the power module 16 (including the inverting circuitry). The fifth cooling plate 46 extends between and is substantially perpendicular to the first cooling plate 38 and the second cooling plate 40. Substantially perpendicular may include an incremental value between exactly perpendicular to 20° from exactly perpendicular. Addition peripheral cooling plates (not shown) may extend between the second cooling plate 40 and the third cooling plate 42 or between the first cooling plate 38 and the second cooling plate 40.

The first cooling plate 38, second cooling plate 40, fifth cooling plate 46, and additional peripheral cooling plates (if any) that extend between the first cooling plate 38 and second cooling plate 40 may be configured to cool the power module 16 (including the inverting circuitry) via heat transfer from direct contact between the power module 16 and the cooling plates (i.e., via conductive heat transfer). The second cooling plate 40, third cooling plate 42, fourth cooling plate 44, and additional peripheral cooling plates (if any) that extend between the second cooling plate 40 and the third cooling plate 42 may be configured to cool the inductor 36 via heat transfer from direct contact between the inductor 36 and the cooling plates (i.e., via conductive heat transfer).

The first cooling plate 38, second cooling plate 40, third cooling plate 42, fourth cooling plate 44, fifth cooling plate 46, and any additional peripheral cooling plates may define cooling channels 48 configured to route the coolant, refrigerant, or other cooling fluid from the supply channel 30 to the outlet channel 32. The first cooling plate 38, second cooling plate 40, third cooling plate 42, fourth cooling plate 44, fifth cooling plate 46, and any additional peripheral cooling plates may comprise some of the external walls 28 of the housing 26. The cooling system 34 as a whole may be considered as a subcomponent of the power controller 10 or as a separate component from the power controller 10.

Figure 4:
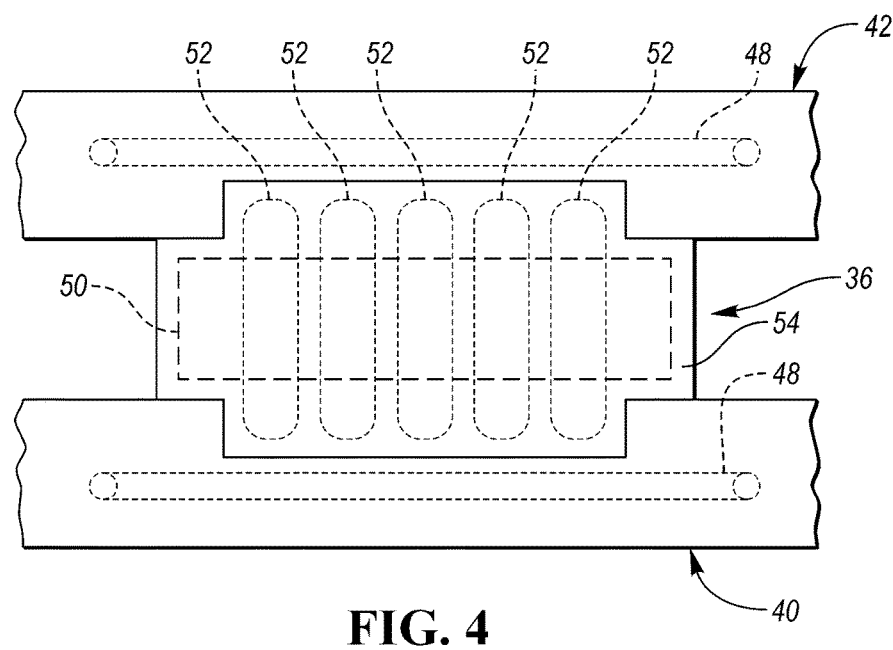
FIG. 4 is a side view of an inductor and a portion of the cooling system.

Referring to FIG. 4 a side view of the inductor 36 and a portion of the cooling system 34 is illustrated. More specifically, the second cooling plate 40 and the third cooling plate 42 of the cooling system 34 are illustrated. The inductor 36 includes a magnetic core 50 and a plurality of coil windings 52. Collectively, the plurality of coil winding may be referred to as the coil 53 (see FIG. 3). A thermally conductive intermediate material 54 may extend from the magnetic core 50 of the inductor 36 to the second cooling plate 40. The thermally conductive intermediate material 54 may also be disposed between the adjacent coil windings 52 of the inductor 36. More specifically, the thermally conductive intermediate material 54 may be disposed within the gaps between adjacent coil windings 52 such the thermally conductive intermediate material 54 extends between the adjacent coils windings 52 and from the magnetic core to the second cooling plate 40. The thermally conductive intermediate material 54 may also extend from the magnetic core 50 of the inductor 36 to the third cooling plate 42. More specifically, the thermally conductive intermediate material 54 may be disposed within the gaps between adjacent coil windings 52 such the thermally conductive intermediate material 54 extends between the adjacent coils windings 52 and from the magnetic core 50 to the third cooling plate 42.

Figure 5:
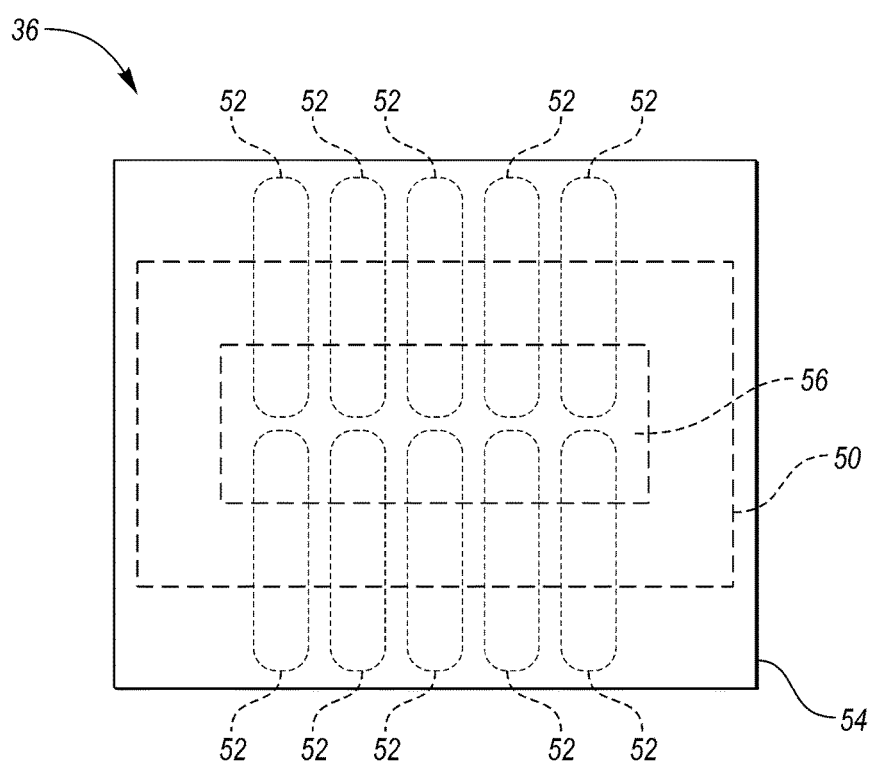
FIG. 5 is a top view of the inductor encased in a thermally conductive intermediate material.

Referring to FIG. 5, a top view of the inductor 36, shown encased in the thermally conductive intermediate material 54, is illustrated. As shown in FIG. 5, the thermally conductive intermediate material 54 may encase the entire inductor 36, including the magnetic core and the coil windings 52. The thermally conductive intermediate material 54 may also extend into a central orifice 56 defined by the magnetic core 50. The thermally conductive intermediate material 54 may be a soft thermal interface material that has both high compressibility and high thermal conductivity. More specifically, the intermediate material 54 may be a composite material that includes a filler suspended within a resin, where the filler has a higher thermal conductivity relative to the resin. For example, the resin could be silicone, epoxy, or any other resin material while the filler could be aluminum oxide, boron nitride, or any other filler material that has a higher thermal conductivity relative to the resin the filler material is being paired with Although FIG. 5 depicts the thermally conductive intermediate material 54 as encasing the entire inductor 36, it should be understood that other embodiments where the thermally conductive intermediate material 54 is not included or does not encase the entire the inductor 36 should be construed as disclosed herein. For example, the thermally conductive intermediate material 54 may only encase the coil windings 52 and a portion of the magnetic core 50, leaving the external ends of the magnetic core 50 exposed. As another example, the thermally conductive intermediate material 54 may only encase a first side of the coil windings 50 such the thermally conductive intermediate material 54 extends between the coil windings 50 of the inductor 36 and only one of the cooling plates (i.e., either the second cooling plate 40 or the third cooling plate 42).

The words used in the specification are words of description rather than limitation, and it is understood that various changes may be made without departing from the spirit and scope of the disclosure. As previously described, the features of various embodiments may be combined to form further embodiments that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. As such, embodiments described as less desirable than other embodiments or prior art implementations with respect to one or more characteristics are not outside the scope of the disclosure and may be desirable for particular applications.

What is claimed is:

1. A vehicle comprising:
   an electric machine;
   a power controller having inverting circuitry and an inductor and configured to deliver electrical power to the electric machine; and
   a cooling system having first, second, and third substantially parallel cooling plates, and arranged such that the inverting circuitry and inductor are disposed on opposing sides of the second cooling plate, and the power controller is sandwiched between the first and third cooling plates.

2. The vehicle of claim 1, wherein the cooling system further includes a fourth cooling plate that is adjacent to the inductor, and extends between and is substantially perpendicular to the second and third cooling plates.

3. The vehicle of claim 2, wherein the cooling system further includes a fifth cooling plate that is adjacent to the inverting circuitry, and extends between and is substantially perpendicular to the first and second cooling plates.

4. The vehicle of claim 1, wherein each of the first, second, and third cooling plates defines cooling channels configured to route a coolant from a supply channel to an outlet channel.

5. The vehicle of claim 1, wherein a thermally conductive intermediate material extends from a magnetic core of the inductor to the second cooling plate and is disposed between adjacent coil windings of the inductor.

6. The vehicle of claim 5, wherein the thermally conductive intermediate material extends from the magnetic core of the inductor to the third cooling plate.

7. The vehicle of claim 5, wherein the thermally conductive intermediate material is a composite material that includes a filler suspended within a resin, the filler having a higher thermal conductivity relative to the resin.

8. A power supply device comprising:
   an inverter configured to convert direct electrical current into alternating electrical current;
   a converter having an inductor and configured to amplify voltage; and
   a cooling system having top, bottom, and intermediate cooling plates, and arranged such that the inverter and inductor are interleaved with the plates and disposed on opposing sides of the intermediate cooling plate.

9. The power supply device of claim 8, wherein the cooling system further includes a first peripheral cooling plate that is adjacent to the inductor, and extends between and is substantially perpendicular to the top and intermediate cooling plates.

10. The power supply device of claim 9, wherein the cooling system further includes a second peripheral cooling plate that is adjacent to the inverter, and extends between and is substantially perpendicular to the bottom and intermediate cooling plates.

11. The power supply device of claim 8, wherein each of the top, bottom, and intermediate cooling plates defines cooling channels configured to route a coolant from a supply channel to an outlet channel.

12. The power supply device of claim 8, wherein a thermally conductive intermediate material extends from a magnetic core of the inductor to the intermediate cooling plate and is disposed between adjacent coil windings of the inductor.

13. The power supply device of claim 12, wherein the thermally conductive intermediate material extends from the magnetic core of the inductor to the top cooling plate.

14. The power supply device of claim 12, wherein the thermally conductive intermediate material is a composite material that includes a filler suspended within a resin, the filler having a higher thermal conductivity relative to the resin.

15. A power supply device comprising:
   a power module including inverting circuitry;
   an inductor; and
   a cooling system having first, second, and third substantially parallel cooling plates, and arranged such that the power module is sandwiched between the first and second cooling plates and the inductor is sandwiched between the second and third cooling plates.

16. The power supply device of claim 15, wherein the cooling system further includes a fourth cooling plate that is adjacent to the inductor, and extends between and is substantially perpendicular to the second and third cooling plates.

17. The power supply device of claim 15, wherein each of the first, second, and third cooling plates defines cooling channels configured to route a coolant from a supply channel to an outlet channel.

18. The power supply device of claim 15, wherein a thermally conductive intermediate material extends from a magnetic core of the inductor to the second cooling plate and is disposed between adjacent coil windings of the inductor.

19. The power supply device of claim 18, wherein the thermally conductive intermediate material extends from the magnetic core of the inductor to the third cooling plate.

20. The power supply device of claim 19, wherein the thermally conductive intermediate material is a composite material that includes a filler suspended within a resin, the filler having a higher thermal conductivity relative to the resin.

\* \* \* \* \*